US010775917B2

(12) United States Patent
Chen (10) Patent No.: US 10,775,917 B2
(45) Date of Patent: Sep. 15, 2020

(54) TOUCH DISPLAY HAVING A COLOR FILTER BETWEEN TOUCH ELECTRODES AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventor: Yu-Ju Chen, Guangdong (CN)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 16/260,075

(22) Filed: Jan. 28, 2019

(65) Prior Publication Data

US 2020/0110494 A1   Apr. 9, 2020

(30) Foreign Application Priority Data

Oct. 8, 2018   (CN) .......................... 2018 1 1167625

(51) Int. Cl.
| | |
|---|---|
| *G06F 3/041* | (2006.01) |
| *G06F 3/044* | (2006.01) |
| *H01L 25/075* | (2006.01) |
| *H01L 33/50* | (2010.01) |
| *H01L 33/56* | (2010.01) |
| *H01L 33/58* | (2010.01) |

(52) U.S. Cl.
CPC ............ *G06F 3/0412* (2013.01); *G06F 3/044* (2013.01); *H01L 25/0753* (2013.01); *H01L 33/502* (2013.01); *H01L 33/56* (2013.01); *H01L 33/58* (2013.01); *G06F 2203/04103* (2013.01); *H01L 2933/005* (2013.01); *H01L 2933/0041* (2013.01); *H01L 2933/0058* (2013.01); *H01L 2933/0091* (2013.01)

(58) Field of Classification Search
CPC .................................... G06F 3/0412
USPC ....................................... 345/174
See application file for complete search history.

(56) References Cited

U.S. PATENT DOCUMENTS

| | | | | |
|---|---|---|---|---|
| 2014/0183478 | A1* | 7/2014 | Lee ......... | H01L 51/56 257/40 |
| 2017/0090634 | A1* | 3/2017 | Yang ........ | G06F 3/047 |
| 2017/0168391 | A1* | 6/2017 | Yoshida .... | G03F 7/38 |
| 2018/0211991 | A1* | 7/2018 | Hsiang ..... | H01L 27/15 |

\* cited by examiner

*Primary Examiner* — Long D Pham
(74) *Attorney, Agent, or Firm* — CKC & Partners Co., LLC (57) ABSTRACT

A touch display device includes a substrate, a light shielding array, a plurality of light emitting elements, a color filter, and a touch control module. The light shielding array is disposed on the substrate, and the light shielding array has a plurality of openings. Each of the light emitting elements is placed in one of the openings. The color filter is disposed over the light shielding array. The touch control module includes a bottom electrode layer disposed between the light shielding array and the color filter and a top electrode layer disposed on the color filter.

9 Claims, 8 Drawing Sheets

TOUCH DISPLAY HAVING A COLOR FILTER BETWEEN TOUCH ELECTRODES AND MANUFACTURING METHOD THEREOF

CROSS-REFERENCE TO RELATED APPLICATION

This application claims priority to China Application Serial Number 201811167625.1, filed Oct. 8, 2018, which is herein incorporated by reference.

BACKGROUND

Field of Invention

The present invention relates to a touch display device, and a manufacturing method of the touch display device.

Description of Related Art

In a conventional capacitive touch display device, the upper and lower touch electrode layers of the touch control module are formed on opposite sides of a transparent substrate. The touch control module is attached to a display device (e.g., a micro light emitting diode (LED) display device), a polarization plate or a cover plate to form the capacitive touch display device.

However, the conventional capacitive touch display device is relatively thicker, so it does not comply with the trend of thin electronic devices. In addition, if the display device has a phosphor powder or a quantum dot material, the ambient light incident from the outside of the device may excite the phosphor powder or the quantum dot material, thereby causing a mura phenomenon.

SUMMARY

An aspect of the present invention is to provide a touch display device comprising a substrate, a light shielding array, a plurality of light emitting elements, a color filter, and a touch control module. The light shielding array is disposed on the substrate, and the light shielding array has a plurality of openings. Each of the light emitting elements is disposed in one of the openings. The color filter is disposed over the light shielding array. The touch control module includes a bottom electrode layer disposed between the light shielding array and the color filter and a top electrode layer disposed on the color filter.

In some embodiments of the present invention, the touch display device further comprises an encapsulating layer that fills the openings and covers the light emitting elements. An upper surface of the encapsulating layer is coplanar with an upper surface of the light shielding array.

In some embodiments of the present invention, the encapsulating layer is doped with light scattering particles.

In some embodiments of the present invention, the encapsulating layer is doped with a phosphor powder or a quantum dot material.

In some embodiments of the present invention, the light emitting elements are micro light emitting diodes.

In some embodiments of the present invention, the color filter has a plurality of filter portions arranged along a first direction. One of the top electrode layer and the bottom electrode layer has a plurality of first electrodes extending along the first direction, and the first electrodes span the filter portions.

In some embodiments of the present invention, the other one of the top electrode layer and the bottom electrode layer has a plurality of second electrodes extending along a second direction perpendicular to the first direction, and the second electrodes overlap the filter portions.

Another aspect of the present invention is to provide a manufacturing method of a touch display device. The method comprises: (i) providing a precursor structure, wherein the precursor structure comprises: a substrate; a light shielding array disposed on the substrate, wherein the light shielding array has a plurality of openings; and a plurality of light emitting elements disposed in the openings; (ii) forming a bottom electrode layer of a touch control module on the light shielding array; (iii) disposing a color filter on the bottom electrode layer of the control module; and (iv) forming a top electrode layer of the touch control module on the color filter.

In some embodiments of the present invention, before forming the bottom electrode layer of the touch control module, the manufacturing method further includes forming an encapsulating layer in the openings.

In some embodiments of the present invention, providing the precursor structure includes: placing the light emitting elements on the substrate by a mass transfer method; and forming the light shielding array on the substrate, wherein the light shielding array has the openings, and the openings expose the light emitting elements.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 3A-7A are cross-sectional views illustrating various process stages of a method for manufacturing a touch display device according to an embodiment of the present invention.

FIGS. 3B-7B are top views corresponding to FIGS. 3A-7A, respectively.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. For the purpose of simplicity and clarity, different features may be depicted with different sizes.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference will now be made in detail to the present embodiments of the invention, examples of which are illustrated in the accompanying drawings. Wherever possible, the same reference numbers are used in the drawings and the description to refer to the same or like parts.

Figure 1:
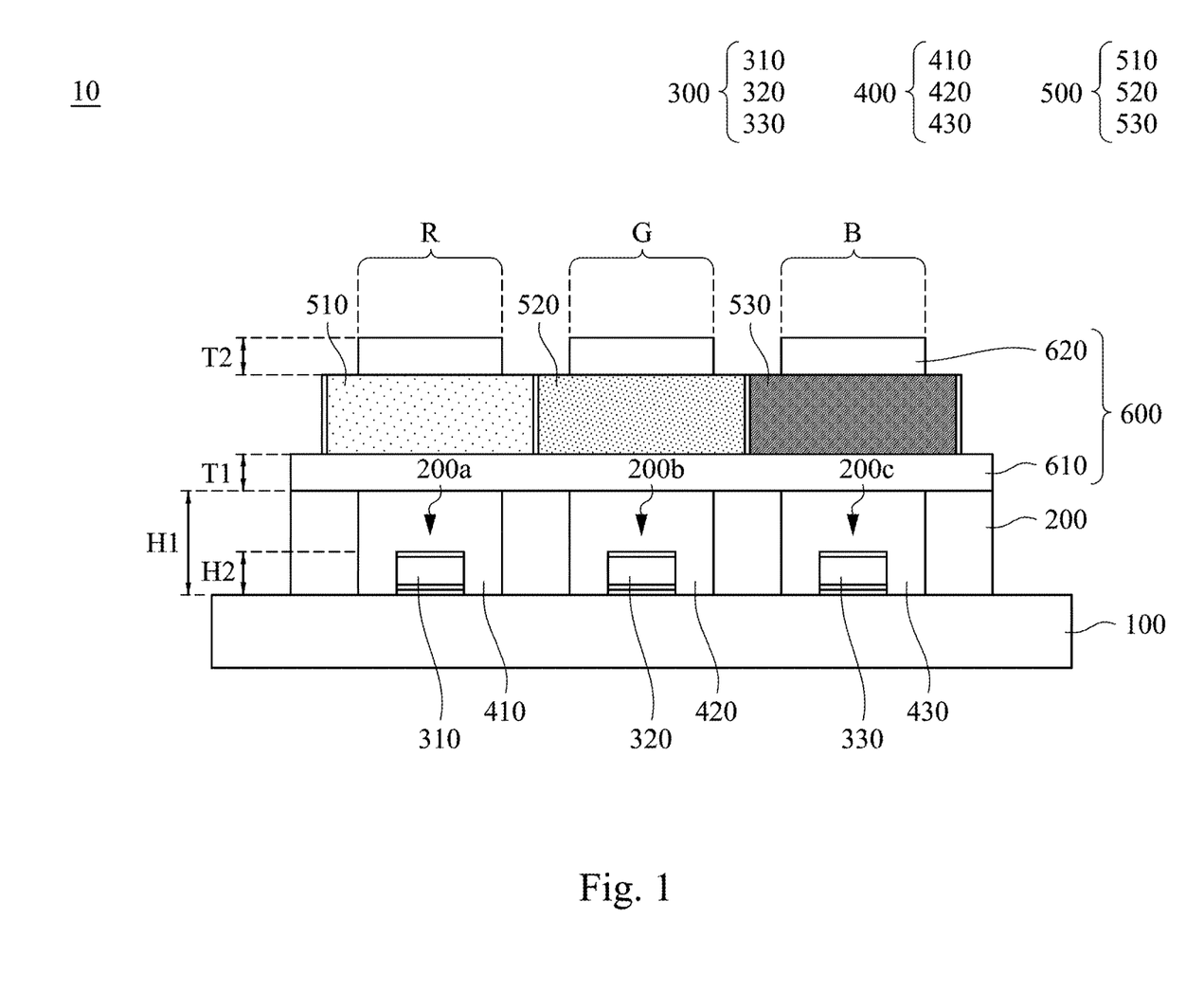
FIG. 1 is a cross-sectional view illustrating a touch display device according to an embodiment of the present invention.

FIG. 1 is a cross-sectional view illustrating a touch display device 10 according to an embodiment of the present invention. The touch display device 10 includes a substrate 100, a light shielding array 200, a light emitting member 300, an encapsulating layer 400, a color filter 500, and a touch control module 600.

In one embodiment, the substrate 100 is a silicon substrate or a glass substrate having thin film transistors formed thereon, but the present invention is not limited thereto.

The light shielding array 200 is disposed on the substrate 100. The light shielding array 200 has a plurality of openings 200a, 200b and 200c. The openings 200a, 200b, and 200c define sub-pixel regions R, G, and B, respectively. In an embodiment, each of the openings 200a, 200b, and 200c has a rectangular contour in a top view, and the openings 200a, 200b, and 200c are aligned with each other on the surface of the substrate 100. However, the shape and the arrangement of the openings 200a, 200b, and 200c are not limited thereto. In an embodiment, the height H1 of the light shielding array 200 is 1-5 micrometers, such as 2 micrometers, 3 micrometers, or 4 micrometers.

In some embodiments, the light shielding array 200 includes a resin that contains a light-shielding material, but is not limited thereto. In one example, the light-shielding material may be carbon particulates, an inorganic pigment, an organic pigment, or the like. The resin may be butyral resin, chlorinated polyethylene resin, polyvinyl chloride resin, polyurethane resin, phenol resin, polyester resin, acrylic resin, alkyd resin, styrene resin, polyamide resin, rubber resin, epoxy resin, polyimide resin, and the like. Since the resin containing the light-shielding material has the opaque characteristic, the light shielding array 200 including thereof also has the opaque characteristic.

As shown in FIG. 1, the light emitting member 300 includes a first light emitting element 310, a second light emitting element 320, and a third light emitting element 330. The first light emitting element 310, the second light emitting element 320, and the third light emitting element 330 are disposed in the openings 200a, 200b, and 200c, respectively. The upper surfaces of the first light emitting element 310, the second light emitting element 320, and the third light emitting element 330 are lower than the upper surface of the light shielding array 200. In one embodiment, the heights H2 of the first light emitting element 310, the second light emitting element 320, and the third light emitting element 330 are in a range from 1 to 4 micrometers, for example, 2 micrometers or 3 micrometers.

The encapsulating layer 400 includes a first portion 410, a second portion 420, and a third portion 430. The first portion 410, the second portion 420, and the third portion 430 fill the openings 200a, 200b, and 200c, respectively. In addition, the first portion 410, the second portion 420, and the third portion 430 cover the first light emitting element 310, the second light emitting element 320, and the third light emitting element 330, respectively. The upper surface of the encapsulating layer 400 is coplanar with the upper surface of the light shielding array 200.

In one embodiment, the encapsulating layer 400 is doped with light scattering particles. By doping light scattering particles into the encapsulating layer 400, the optical length of the light emitted from the touch display device 10 can be increased. In some examples, the light scattering particles include a resin or an inorganic material. The resin may be polysulfone, polyimide, polyacrylate, polystyrene or a combination thereof. The inorganic material may be silicon dioxide, titanium dioxide or a combination thereof. In some examples, the light scattering particles have a particle diameter of from 0.1 to 6 micrometers, such as 0.3 micrometers, 0.5 micrometers, 1 micrometers, 2 micrometers, 3 micrometers, 4 micrometers, or 5 micrometers. Here, the term "particle diameter" refers to a diameter corresponding to a sphere having the same volume as the particle, wherein the particle diameter of the particle is measured by a laser diffraction/scattering method. When the particle diameter of the light scattering particles is larger than 6 micrometers, the transmittance of the encapsulating layer 400 may be disadvantageously affected. When the particle diameter of the light scattering particles is less than 0.1 micrometers, the light scattering particles may aggregate and cannot be effectively dispersed.

In one embodiment, the first light emitting element 310, the second light emitting element 320, and the third light emitting element 330 are micro light emitting diode (micro-LED), and the first light emitting element 310, the second light emitting element 320, and the third light emitting element 330 can respectively emit red light, green light, and blue light, but not limited thereto. For example, a semiconductor material such as gallium phosphide (GaP), aluminum gallium arsenide (AlGaAs), or gallium arsenide phosphide (GaAsP) may be used to fabricate the first light emitting element 310 that can emit red light. A nitride semiconductor material such as indium nitride (InN) or indium gallium nitride (InGaN) may be used to fabricate the second light emitting element 320 that can emit green light. A nitride semiconductor material such as aluminum nitride (AlN) or gallium nitride (GaN) may be used to fabricate the third light emitting element 330 that can emit blue light.

In another embodiment, the first light emitting element 310, the second light emitting element 320, and the third light emitting element 330 emit blue light, and the first portion 410 and the second portion 420 of the encapsulating layer 400 are doped with a phosphor powder or a quantum dot material. For example, a nitride semiconductor material such as aluminum nitride (AlN) or gallium nitride (GaN) may be used to fabricate the first light emitting element 310, the second light emitting element 320, and the third light emitting element 330.

In some examples, the first portion 410 of the encapsulating layer 400 is doped with a red phosphor powder or a red quantum dot material, while the second portion 420 of the encapsulating layer 400 is doped with a green phosphor powder or a green quantum dot material. Accordingly, the blue light emitted from the first light emitting element 310 can be converted into red light by the red phosphor powder or the red quantum dot material, and the blue light emitted from the second light emitting element 320 can be converted into green light by the green phosphor powder or the green quantum dot material. The red phosphor powder or the red quantum dot materials may be any known phosphor powder or quantum dot materials that can convert blue light into red light, and the green phosphor powder or the green quantum dot materials may be any known phosphor powder or quantum dot materials that can convert blue light into green light.

The color filter 500 is disposed over the light shielding array 200. The color filter 500 has a first filter portion 510, a second filter portion 520, and a third filter portion 530. The first filter portion 510, the second filter portion 520, and the third filter portion 530 correspond to the openings 200a, 200b, and 200c, respectively. The first filter portion 510, the second filter portion 520, and the third filter portion 530 overlap the sub-pixel regions R, G, and B, respectively.

In an embodiment, the first filter portion 510, the second filter portion 520, and the third filter portion 530 include a resin that contains a colorant, but are not limited thereto. The colorant may be an inorganic pigment or an organic pigment of various colors such as red, green, or blue. The resin may be butyral resin, chlorinated polyethylene resin, polyvinyl chloride resin, polyurethane resin, phenol resin, polyester resin, acrylic resin, alkyd resin, styrene resin, polyamide resin, rubber resin, epoxy resin, polyimide resin, or the like.

In one embodiment, the first filter portion 510, the second filter portion 520, and the third filter portion 530 respectively include a resin that contains a red pigment, a resin that contains a green pigment, and a resin that contains a blue pigment. Only the light with a specific wavelength range can be transmitted through the resin containing the colorant, so that the first filter portion 510, the second filter portion 520, and the third filter portion 530 may achieve the function of the light filtering. For example, the first filter portion 510, the second filter portion 520, and the third filter portion 530 respectively include a resin containing a red pigment, a resin that contains a green pigment, and a resin containing a blue pigment, so that only red wavelength light can be transmitted through the first filter portion 510, only green wavelength light can be transmitted through the second filter portion 520, and only blue wavelength light can be transmitted through the third filter portion 530. Accordingly, the first filter portion 510, the second filter portion 520, and the third filter portion 530 respectively filter out the lights of undesired wavelengths emitted from the openings 200a, 200b, and 200c, so that the lights passing through the first filter portion 510, the second filter portion 520, and the third filter portion 530 have specific wavelength ranges, and the colors of lights become more saturated.

As described above, in certain embodiments, the encapsulating layer 400 is doped with phosphor powder(s) or quantum dot material(s). In this case, the ambient light incident from the outside of the device can be filtered out by the color filter 500 to avoid the mura phenomenon caused by the ambient light exciting the phosphor powder or the quantum dot material.

The touch control module 600 includes a bottom electrode layer 610 and a top electrode layer 620. The bottom electrode layer 610 is disposed between the light shielding array 200 and the color filter 500, and the top electrode layer 620 is disposed on the color filter 500. As described above, the upper surface of the encapsulating layer 400 is coplanar with the upper surface of the light shielding array 200. Therefore, the bottom electrode layer 610 can be formed flat on the encapsulating layer 400 and the light shielding array 200. In some examples, the bottom electrode layer 610 has a thickness T1 ranged from 1 to 2.5 micrometers, such as 1.5 micrometers, 1.8 micrometers, 2.1 micrometers, or 2.3 micrometers. In some examples, the top electrode layer 620 has a thickness T2 ranged from 1 to 2.5 micrometers, such as 1.5 micrometers, 1.8 micrometers, 2.1 micrometers, or 2.3 micrometers.

Figure 2A:
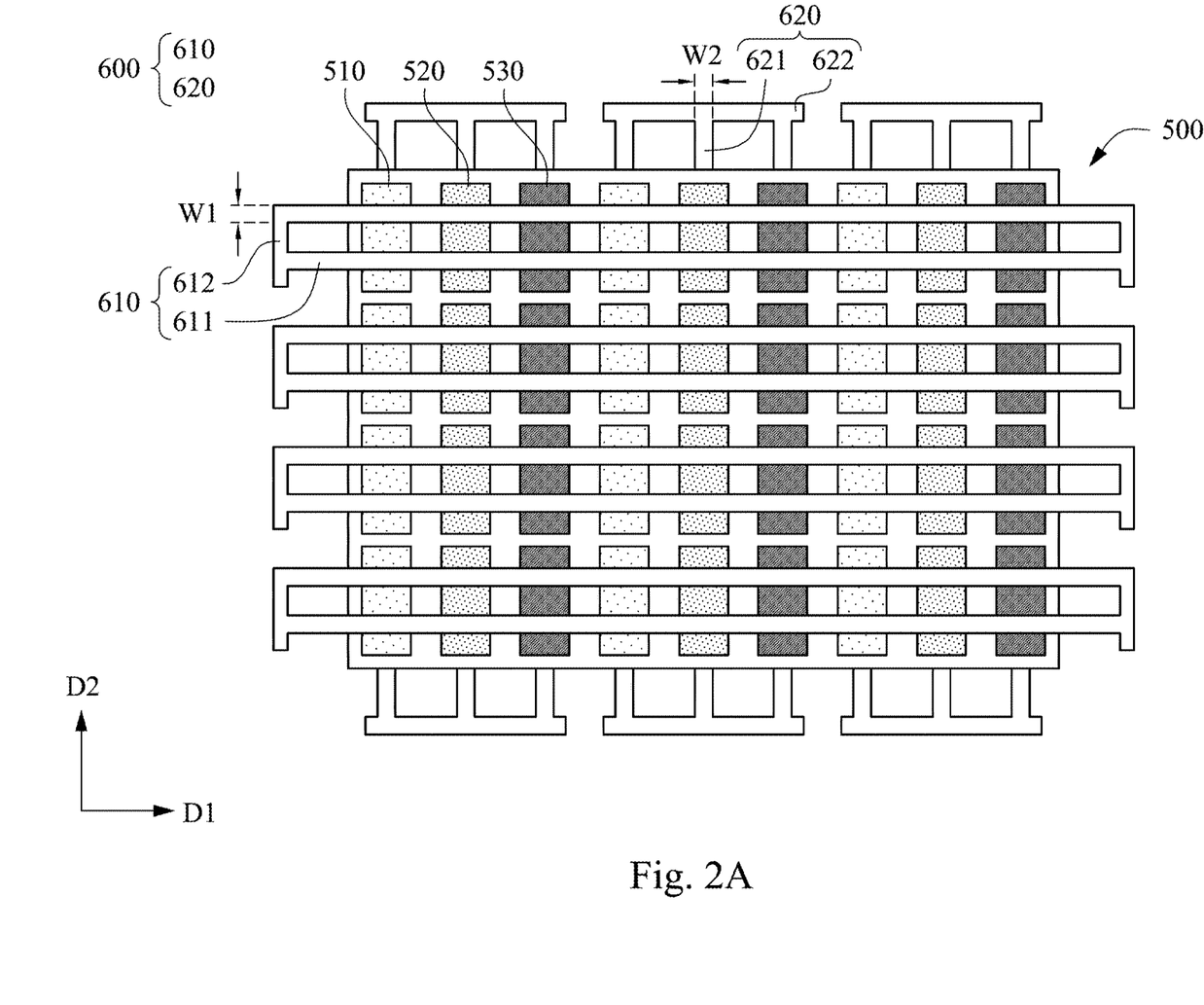
FIG. 2A is a bottom view illustrating a color filter and a touch control module according to an embodiment of the present invention.

Please refer to FIG. 2A for a clearer understanding of the color filter 500 and the touch control module 600. FIG. 2A is a bottom view illustrating the color filter 500 and the touch control module 600 according to an embodiment of the present invention. As shown in FIG. 2A, the color filter 500 has a first filter portion 510, a second filter portion 520, and a third filter portion 530 arranged along the first direction D1. The bottom electrode layer 610 of the touch control module 600 has a plurality of first electrodes 611 extending along the first direction D1 and a plurality of first connectors 612 each connecting with two adjacent first electrodes 611. Each of the first electrodes 611 spans the first filter portion 510, the second filter portion 520, and the third filter portion 530. The top electrode layer 620 of the touch control module 600 has a plurality of second electrodes 621 extending along the second direction D2 and a plurality of second connectors 622 each connecting with corresponding second electrodes 621. In one embodiment, the first direction D1 is perpendicular to the second direction D2. Each of the second electrodes 621 overlaps one of the first filter portion 510, the second filter portion 520, and the third filter portion 530.

In some examples, the widths W1 of the first electrodes 611 are less than 50 micrometers, such as 40 micrometers, 30 micrometers, 20 micrometers, 10 micrometers, 5 micrometers, or 2 micrometers. In some examples, the widths W2 of the second electrodes 621 are less than 50 micrometers, such as micrometers, 30 micrometers, 20 micrometers, 10 micrometers, 5 micrometers, or 2 micrometers. In some examples, the first electrodes 611, the first connectors 612, the second electrodes 621, and the second connectors 622 include indium tin oxide (ITO), indium zinc oxide (IZO), indium tin fluorine oxide (ITFO), aluminum zinc oxide (AZO), fluorine zinc oxide (FZO), silver nanowire (Ag-NW) or carbon nanotube (CNT), etc., but not limited thereto.

In other embodiment, the arrangement of the bottom electrode layer 610 and the top electrode layer 620 of the touch control module 600 are interchanged. In other words, the bottom electrode layer 610 have a plurality of first electrodes 611 extending along the second direction D2, and each of the first electrodes 611 overlaps one of the first filter portion 510, the second filter portion 520, and the third filter portion 530. Furthermore, the top electrode layer 620 has a plurality of second electrodes 621 extending along the first direction D1, and each of the second electrodes 621 spans the first filter portion 510, the second filter portion 520, and the third filter portion 530.

Figure 2B:
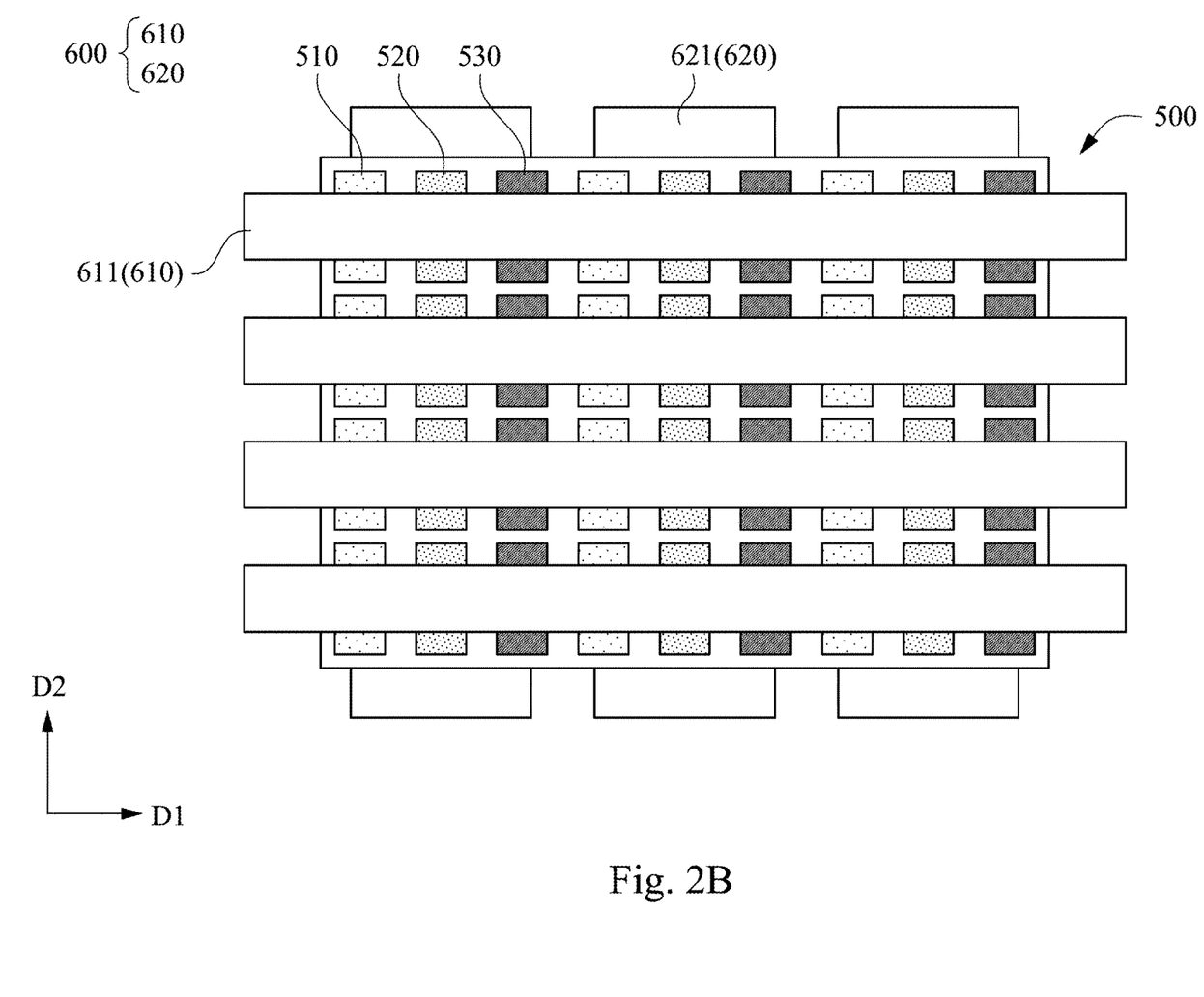
FIG. 2B is a bottom view illustrating a color filter and a touch control module according to another embodiment of the present invention.

Please refer to FIG. 2B, which is a bottom view illustrating the color filter 500 and the touch control module 600 according to another embodiment of the present invention. It should be noted that in FIG. 2B, the same or similar elements as those in FIG. 2A are given the same reference numerals, and the description thereof is omitted. The structure depicted in FIG. 2B is similar to that in FIG. 2A except that the bottom electrode layer 610 of FIG. 2B does not have the first connector 612, and one first electrode 611 spans the first filter portion 510, the second filter portion 520, and the third filter portion 530. In addition, the top electrode layer 620 does not have the second connector 622, and the first filter portion 510, the second filter portion 520, and the third filter portion 530 overlap the same one of second electrodes 621.

A manufacturing method of the touch display device 10 is also provided in the present disclosure. FIGS. 3A-7A are cross-sectional views illustrating various process stages of a method for manufacturing the touch display device 10 according to an embodiment of the present invention, and FIGS. 3B-7B are top views corresponding to FIGS. 3A-7A, respectively.

Figure 3A:
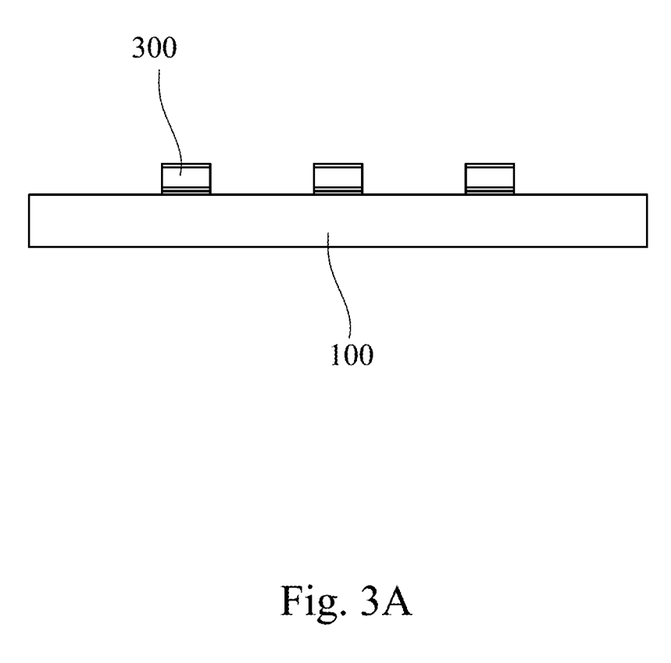
Figure 3B:
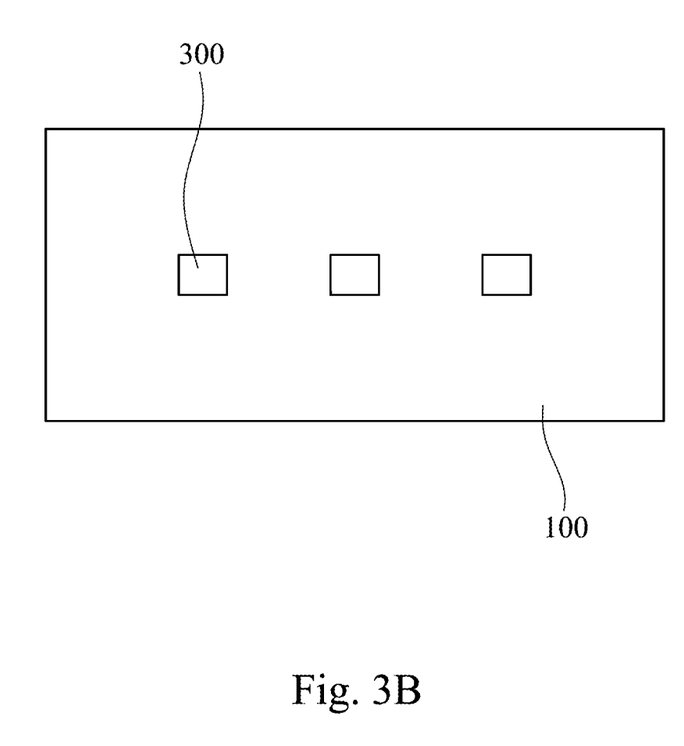

As shown in FIGS. 3A and 3B, a plurality of light emitting elements 300 are formed on the substrate 100. Specifically, the light emitting elements 300 are connected to the substrate 100 using an anisotropic conductive film (ACF) or a eutectic bonding method. In some examples, the light emitting elements 300 are disposed on the substrate 100 by a mass transfer (massive transfer) method.

Figure 4A:
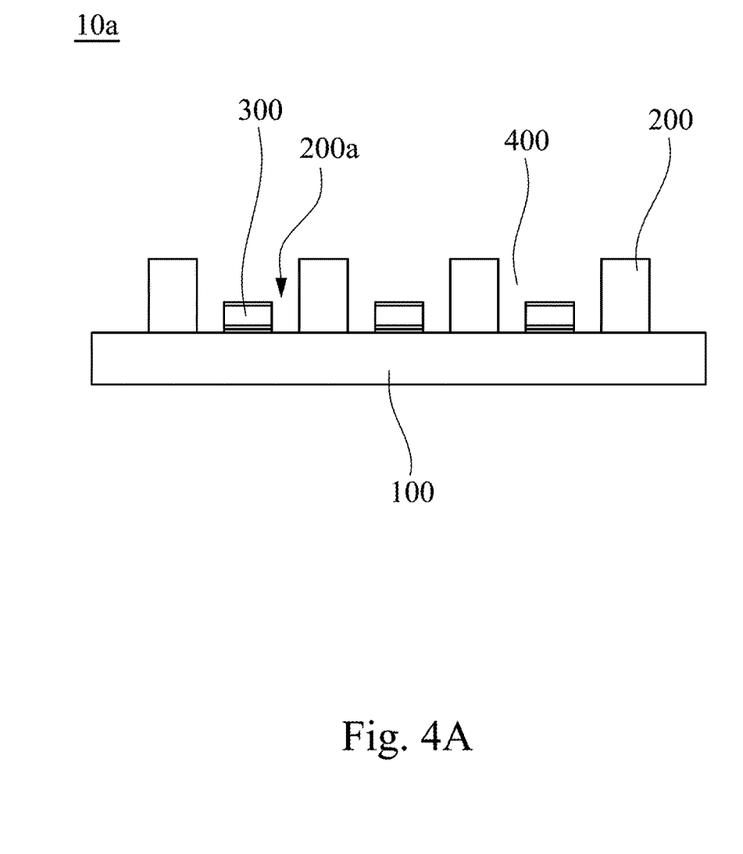
Figure 4B:
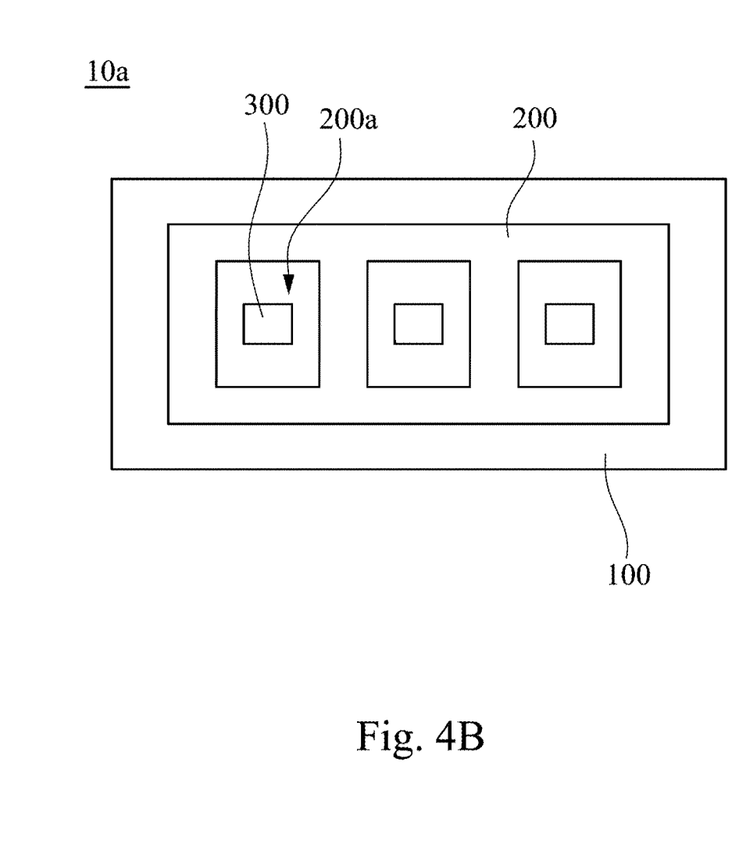

As shown in FIGS. 4A and 4B, a light shielding array 200 is formed on the substrate 100, thereby forming a precursor structure 10a. The light shielding array 200 has a plurality of openings 200a, and the openings 200a expose the light emitting elements 300.

Figure 5A:
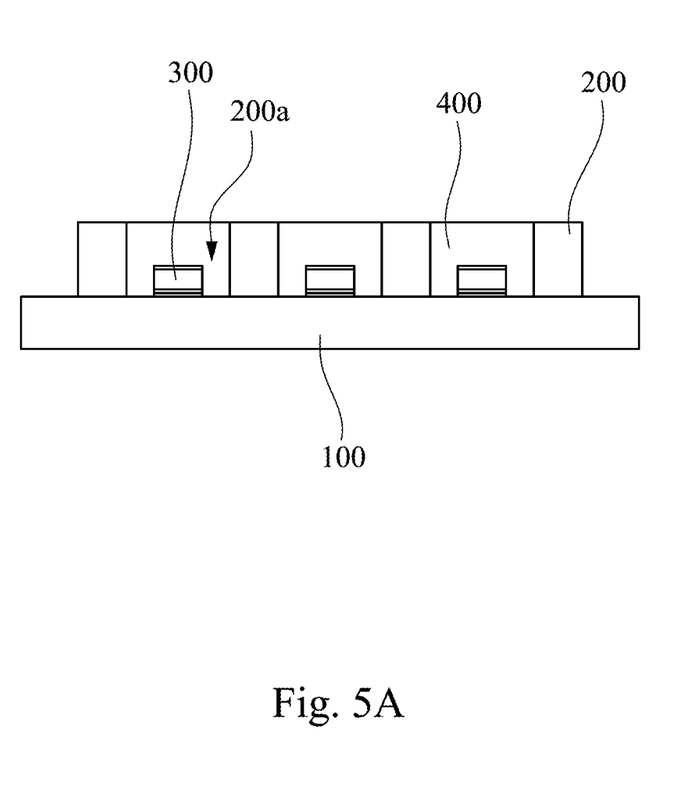
Figure 5B:
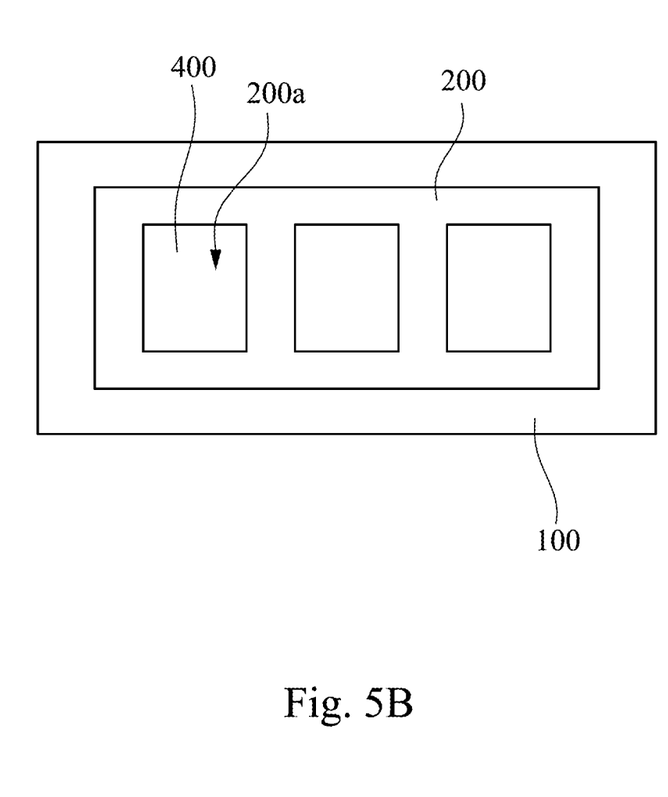

As shown in FIGS. 5A and 5B, an encapsulating layer 400 is formed to fill the openings 200a, wherein the encapsulating layer 400 covers the light emitting elements 300, and the upper surface of the encapsulating layer 400 is coplanar with the upper surface of the light shielding array 200.

Figure 6A:
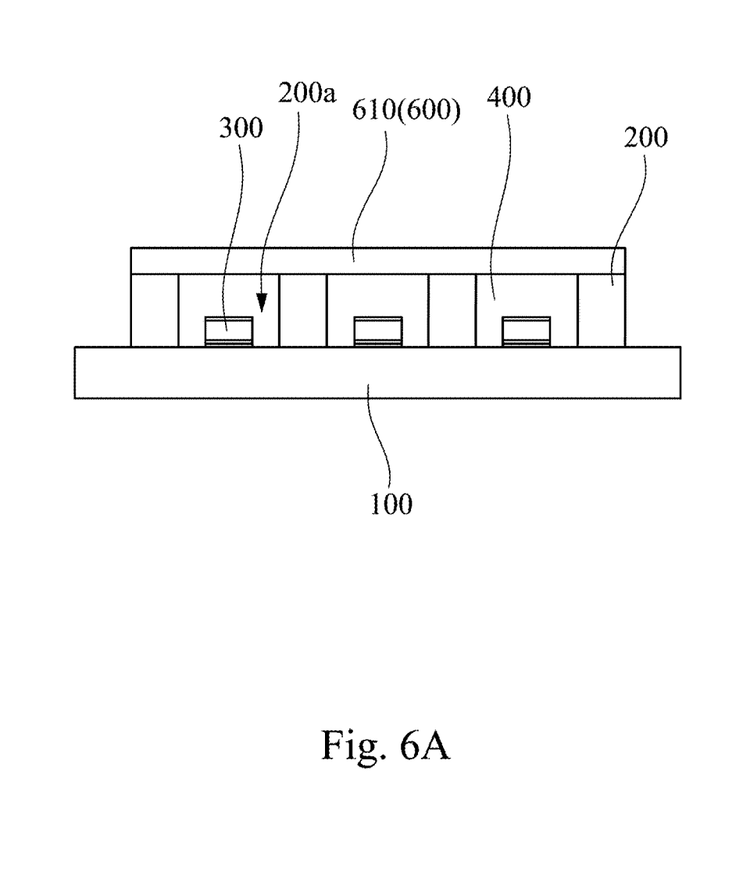
Figure 6B:
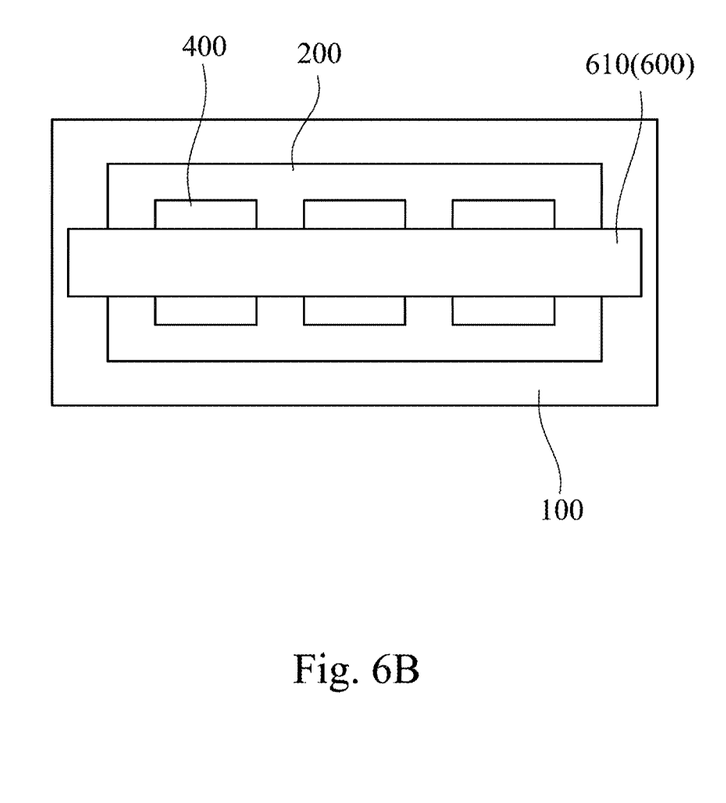

As shown in FIGS. 6A and 6B, a bottom electrode layer 610 of a touch control module 600 is formed on the light shielding array 200 and the encapsulating layer 400.

Figure 7A:
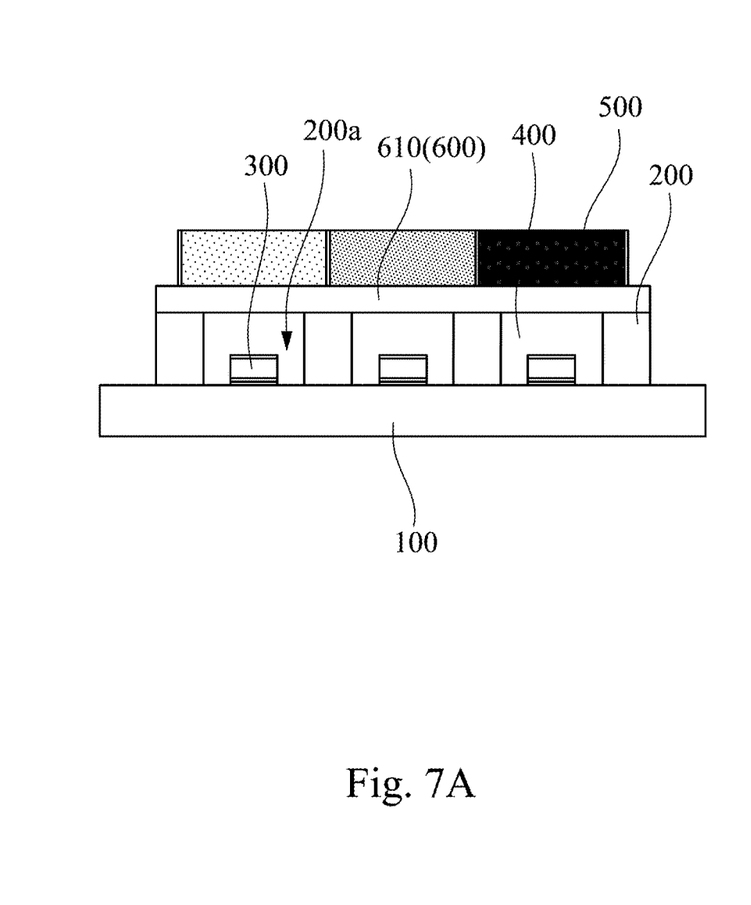
Figure 7B:
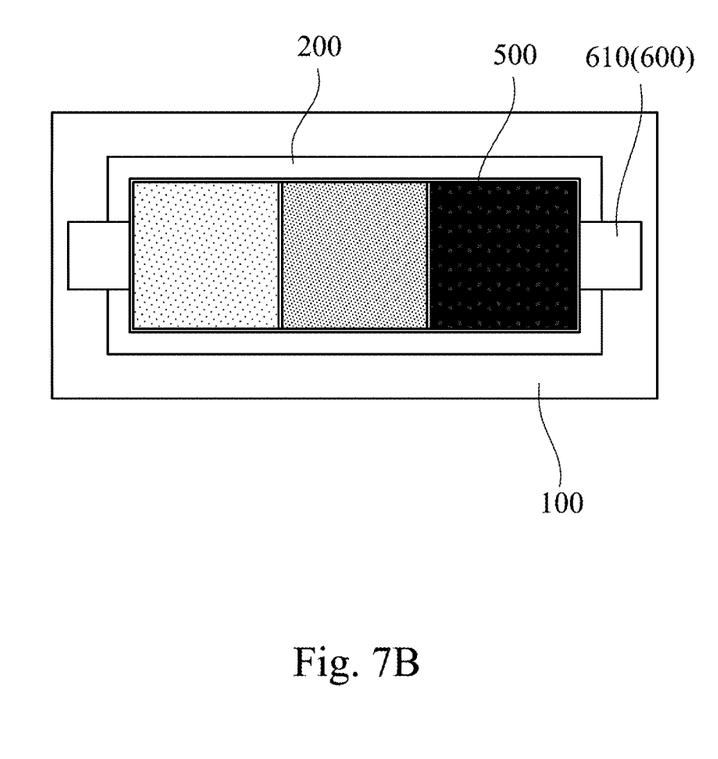

As shown in FIGS. 7A and 7B, a color filter 500 is disposed on the bottom electrode layer 610 of the touch control module 600.

Next, a top electrode layer 620 of the touch control module 600 is formed on the color filter 500, thereby forming the touch display device 10 as shown in FIG. 1.

From the embodiments described above of the present invention, the touch control module disclosed herein is integrated with the color filter in the touch display device, so that the total thickness of the device is reduced, which complies with the trend of thin electronic devices. In addition, the color filter can filter out the ambient light incident from the outside of the device to avoid the mura phenomenon.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A touch display device, comprising:
   a substrate;
   a light shielding array disposed on the substrate, wherein the light shielding array has a plurality of openings;
   a plurality of light emitting elements disposed in the openings;
   an encapsulating layer filling the openings;
   a color filter disposed over the light shielding array; and
   a touch control module including:
   a bottom electrode layer disposed between the light shielding array and the color filter, wherein the bottom electrode layer is in direct contact with the encapsulating layer; and
   a top electrode layer disposed on the color filter.

2. The touch display device of claim 1, wherein the encapsulating layer covers the light emitting elements, and an upper surface of the encapsulating layer is coplanar with an upper surface of the light shielding array.

3. The touch display device of claim 2, wherein the encapsulating layer is doped with light scattering particles.

4. The touch display device of claim 2, wherein the encapsulating layer is doped with a phosphor powder or a quantum dot material.

5. The touch display device of claim 1, wherein the light emitting elements are micro light emitting diodes.

6. The touch display device of claim 1, wherein the color filter has a plurality of filter portions arranged along a first direction, one of the top electrode layer and the bottom electrode layer has a plurality of first electrodes extending along the first direction, and the first electrodes span the filter portions.

7. The touch display device of claim 6, wherein the other one of the top electrode layer and the bottom electrode layer has a plurality of second electrodes extending along a second direction perpendicular to the first direction, and the second electrodes overlap the filter portions.

8. A manufacturing method of a touch display device, comprising:
   providing a precursor structure, wherein the precursor structure comprises:
   a substrate;
   a light shielding array disposed on the substrate, wherein the light shielding array has a plurality of openings; and
   a plurality of light emitting elements disposed in the openings;
   forming an encapsulating layer in the openings;
   forming a bottom electrode layer of a touch control module on the light shielding array, wherein the bottom electrode layer is in direct contact with the encapsulating layer;
   disposing a color filter on the bottom electrode layer of the touch control module; and
   forming a top electrode layer of the touch control module on the color filter.

9. The manufacturing method of claim 8, wherein providing the precursor structure includes:
   placing the light emitting elements on the substrate by a mass transfer method; and
   forming the light shielding array on the substrate, wherein the light shielding array has the openings, and the openings expose the light emitting elements.

* * * * *